United States Patent [19]
Sannomiya et al.

[11] Patent Number: 5,964,962
[45] Date of Patent: Oct. 12, 1999

[54] SUBSTRATE FOR SOLAR CELL AND METHOD FOR PRODUCING THE SAME; SUBSTRATE TREATMENT APPARATUS; AND THIN FILM SOLAR CELL AND METHOD FOR PRODUCING THE SAME

[75] Inventors: Hitoshi Sannomiya, Osaka; Hiroshi Kumada; Minoru Murakami, both of Tenri; Takashi Tomita, Nara, all of Japan

[73] Assignee: Sharp Kabushiki Kaisha, Osaka, Japan

[21] Appl. No.: 08/747,656

[22] Filed: Nov. 13, 1996

[30] Foreign Application Priority Data

Nov. 13, 1995 [JP] Japan .................................. 7-294604
Nov. 1, 1996 [JP] Japan .................................. 8-292150

[51] Int. Cl.$^6$ .................................................. H01L 31/00
[52] U.S. Cl. .............................................................. 136/256
[58] Field of Search ............................................... 136/256

[56] References Cited

U.S. PATENT DOCUMENTS 4,806,436  2/1989  Tada et al. ............................. 136/256

FOREIGN PATENT DOCUMENTS

| 58-57756 | 4/1983 | Japan . |
| 59-159574 | 9/1984 | Japan . |
| 1-219043 | 9/1989 | Japan . |
| 2-164077 | 6/1990 | Japan . |
| 7-122764 | 5/1995 | Japan . |

*Primary Examiner*—Mark Chapman
*Attorney, Agent, or Firm*—Birch, Stewart, Kolasch & Birch, LLP

[57] ABSTRACT

A substrate for a solar cell has a first surface with minute unevenness formed by spraying abrasive grains with a count of #2000 or higher, on which a layered structure for photoelectric transfer is to be formed, wherein the unevenness on the first surface of the substrate has a difference in height between convex portions and concave portions of around 0.1 to 0.5 $\mu$m.

19 Claims, 7 Drawing Sheets

SUBSTRATE FOR SOLAR CELL AND METHOD FOR PRODUCING THE SAME; SUBSTRATE TREATMENT APPARATUS; AND THIN FILM SOLAR CELL AND METHOD FOR PRODUCING THE SAME

BACKGROUND OF THE INVENTION

1. Field of the Invention

The present invention relates to a substrate for a solar cell, a method for producing the same, and a substrate treatment apparatus. In particular, the present invention relates to unevenness of the surface of a substrate for a thin film solar cell and a treatment process for forming the unevenness.

Furthermore, the present invention relates to a thin film solar cell and a method for producing the same. In particular, the present invention relates to unevenness of the surface of a substrate for a thin film solar cell and a method for forming the unevenness.

2. Description of the Related Art

Amorphous silicon (Si) solar cells can be produced at a relatively low temperature of around 100° C. to 200° C. Therefore, various materials can be used for a substrate for forming an amorphous Si solar cell. In general, a glass substrate and a stainless steel substrate are used often.

In the amorphous Si solar cell, the thickness of a light absorbing layer at which a conversion efficiency becomes maximum is as thin as around 500 nm. Thus, in order to improve the conversion-efficiency, it is important to increase the amount of light absorbed by the light absorbing layer having a thickness in this range. Because of this, conventional solutions have used a transparent conductive film with unevenness on its surface formed on a glass substrate or a metal film with unevenness on its surface formed on a stainless steel substrate to increase an optical path length of light in the light absorbing layer.

In the case of increasing an optical path length in the light absorbing layer by the above-mentioned methods, a short-circuit current is known to improve by 30% or more, compared with the case where an amorphous Si solar cell is formed on a flat substrate without unevenness.

In order to form unevenness on the surface of a glass substrate, unevenness is generally formed on an $SnO_2$ film provided as a transparent electrode by an ordinary pressure CVD method. Such methods for forming unevenness on transparent electrodes are disclosed in Japanese Laid-Open Patent Publication Nos. 58-57756 and 59-159574. However, these publications refer to only the average sizes of the crystal particles on the transparent electrodes and fail to describe the magnitude of unevenness formed on the transparent electrodes.

Furthermore, in order to form unevenness on the surface of a metal substrate made of stainless steel or the like, an Ag film is formed by vapor deposition or sputtering in such a manner that the Ag film is provided with unevenness by adjusting the forming conditions of the Ag film, or an Ag film is formed and heat-treated so as to have unevenness.

In contrast, Japanese Laid-Open Patent Publication No. 2-164077 discloses that unevenness is directly formed on the surface of a glass substrate and the substrate thus provided with unevenness is used for a solar cell. Japanese Laid-Open Patent Publication No. 7-122764 discloses a method for treating the surface of a glass substrate for a solar cell by sandblasting, using abrasive grains with a count of #100 to #8000, in particular #200, thereby forming a scattering reflective surface having unevenness whose average difference in height between convex portions and concave portions is 3 $\mu$m.

Japanese Laid-Open Patent Publication No. 1-219043 discloses a method for obtaining uniform unevenness of the surface of a substrate. According to this method, minute and uniform unevenness is formed on the surface of a glass substrate by sandblasting, and then, a $SnO_2$ film containing large crystal particles with unevenness whose average difference in height between convex portions and concave portions is 0.05 to 0.5 $\mu$m is formed on the glass substrate. However, this method does not utilize the unevenness directly formed on the glass substrate by sandblasting. The glass substrate is first subjected to sandblasting so as to have unevenness, and the $SnO_2$ film is formed thereon. Thus, in this method, the $SnO_2$ film with more uniform unevenness can be formed, compared with the conventional example in which a $SnO_2$ film with unevenness is formed on a flat glass substrate. Referring to the description of the specification and drawings of Japanese Laid-Open Patent Publication No. 1-219043, the unevenness on the glass substrate is judged to be smaller than that of the $SnO_2$ film. In this method, relatively large abrasive grains with a count of #2000 or lower are used for forming unevenness on the glass substrate.

A $SnO_2$ film can be formed on a glass substrate by an ordinary pressure CVD method, which is easily conducted. However, a temperature for forming the $SnO_2$ film is required to be high, i.e., around 500° C., so that the $SnO_2$ film cannot be formed on reinforced glass. This is because reinforced glass has its reinforcement degraded at a temperature of 300° C. or higher. However, reinforced glass is required for protecting the surface of a power solar cell.

In the case of using an ordinary glass substrate which is not reinforced, there is a problem that a solar cell module has a double-structure of reinforced glass and ordinary glass, resulting in the increase in production cost.

Furthermore, in order to sufficiently scatter light, the transparent electrode as described above is required to be formed to a thickness of around 1 $\mu$m. This causes an increase in time required for forming a substrate for a solar cell and material cost.

Conventionally, there has been a method for directly forming unevenness on the surface of a glass substrate. However, according to this method, unevenness as minute as that obtained by using a transparent conductive film cannot be formed. For example, Japanese Laid-Open Patent Publication No. 2-164077 discloses that unevenness is formed on the surface of a glass substrate by treating the substrate, using a machine grinding method. According to this method, since the magnitude of the unevenness depends upon the size of a blade used for grinding, the difference in height between convex portions and concave portions becomes tens of $\mu$m. Furthermore, there are problems because it takes a long time to form the unevenness and the unevenness having a magnitude most effective for improving efficiency, i.e., minute unevenness with a thickness equal to or smaller than an amorphous film, cannot be formed.

In the case where a stainless steel substrate is used for a solar cell, unevenness is formed on the surface of the stainless steel substrate by adjusting the conditions of forming an Ag film by vapor deposition or sputtering, or by conducting a heat treatment after forming an Ag film. An Ag film with unevenness is required to be formed at a high temperature of 350° C. or higher. Therefore, there are problems because it takes a long time to increase and decrease the temperature of the substrate and the substrate warps. Furthermore, since stainless steel substrates have scratches on their surfaces, it is required to subject the substrate to a grinding treatment for the purpose of improving yield, which results in the increase in cost.

According to the above-mentioned method disclosed in Japanese Laid-Open Patent Publication No. 7-122764, since the magnitude of unevenness of the surface of a substrate formed by sandblasting is large, a defective layer caused by sandblasting is required to be removed by etching. Furthermore, according to this method, in order to smooth the concave portions of the unevenness, $SiO_2$ is required to be deposited in the concave portions. In the sandblasting, liquid in which abrasive grains are dispersed in water is sprayed onto the surface of a substrate. Therefore, acute unevenness is formed, depending upon the count of the abrasive grains.

According to the above-mentioned method disclosed by Japanese Laid-Open Patent Publication No. 1-219043, there is a problem that the steps of sandblasting, cleaning, and drying are added to the conventional process, resulting in an increase in production cost.

As described above, according to the conventional methods, in the case where a transparent conductive film or an Ag film is formed on a substrate, a high temperature of 350° or higher is required for forming unevenness on the surface of the transparent conductive film or the Ag film. Furthermore, a heat treatment after the formation of the transparent conductive film or the Ag film requires a temperature of around 500° C. Because of this, it takes a long time to increase and decrease the temperature during a treatment at high temperature, which results in low throughput of an apparatus for producing a substrate for a solar cell and large power consumption.

SUMMARY OF THE INVENTION

According to the present invention, a substrate for a solar cell has a first surface with minute unevenness formed by spraying abrasive grains with a count of #2000 or higher, on which a layered structure for photoelectric transfer is to be formed, wherein the unevenness on the first surface of the substrate has a difference in height between convex portions and concave portions of around 0.1 to 0.5 μm.

According to an other aspect of the present invention, a method for producing a solar cell includes the step of spraying abrasive grains with a count of #2000 or higher onto a first surface of a substrate having the first surface and a second surface of the substrate which is substantially in parallel with the first surface, thereby forming minute unevenness on the first surface, wherein an injection pressure for spraying the abrasive grains is around 2 to 10 kg/cm² and an injection distance is around 40 to 300 mm.

In one embodiment of the present invention, the method further includes the step of forming a layered structure for photoelectric transfer on the first surface of the substrate, the layered structure having a third surface opposing the first surface, wherein the third surface has unevenness whose difference in height between convex portions and concave portions is around 0.1 to 0.5 μm.

In another embodiment of the present invention, the unevenness has an average difference in height between convex portions and concave portions of around 0.1 to 0.5 μm.

In another embodiment of the present invention, the method further includes the step of forming a transparent conductive film on the first surface of the substrate between the first surface and the layered structure for photoelectric transfer. In this embodiment, the substrate is made of glass or a transparent polymer, light is incident upon the second surface of the substrate, and a top surface of the transparent conductive film is in contact with the third surface of the layered structure for photoelectric transfer and has unevenness whose difference in height between convex portions and concave portions is around 0.1 to 0.5 μm.

In another embodiment of the present invention, the method further includes the step of forming a transparent conductive film on the first surface of the substrate, wherein a surface of the transparent conductive film has unevenness whose difference in height between convex portions and concave portions is around 0.1 to 0.5 μm.

In another embodiment of the present invention, the transparent conductive film is formed by sputtering.

In another embodiment of the present invention, ZnO or ITO is used as a material for the transparent conductive film.

In another embodiment of the present invention, the substrate is made of stainless steel or a polymer, and light is reflected from the first surface of the substrate.

In another embodiment of the present invention, the method further includes the step of forming a metal reflecting electrode on the first surface of the substrate, and the surface of the metal reflecting electrode has unevenness whose difference in height between convex portions and concave portions is around 0.1 to 0.5 μm.

In another embodiment of the present invention, the method further includes the steps of: forming a metal reflecting electrode on the first surface of the substrate and forming a transparent conductive film on the metal reflecting electrode, wherein a surface of the transparent conductive film has unevenness whose difference in height between convex portions and concave portions is around 0.1 to 0.5 μm.

According to another aspect of the present invention, a substrate treatment apparatus includes: a first holder for holding a first end of a band-shaped flexible substrate wound into a roll-shape in such a manner that the flexible substrate can be delivered; a second holder for holding a second end of the flexible substrate wound into a roll-shape in such a manner that the flexible substrate can be taken up; and a substrate treatment unit for subjecting the surface of the flexible substrate to sandblasting, provided in a substrate treatment region in a path through which the flexible substrate is transferred from the first holder to the second holder, wherein the surface of the flexible substrate passing through the substrate treatment region is continuously subjected to sandblasting in the substrate treatment region, whereby minute unevenness is formed on the substrate of the flexible substrate.

In one embodiment of the present invention, a region in which the first holder is placed, a region in which the second holder is placed, and a region in which the substrate treatment unit is placed are respectively separated into a first holding chamber, a second holding chamber, and a substrate treatment chamber which are independent from each other.

In another embodiment of the present invention, the substrate treatment chamber is partitioned from the regions outside of the substrate treatment chamber by air curtains provided at an inlet portion and an outlet portion of the substrate treatment chamber.

In another embodiment of the present invention, the substrate treatment unit includes a plurality of injection nozzles which are arranged in a direction normal to a moving direction of the flexible substrate in the substrate treatment region and spray abrasive grains onto the surface of the flexible substrate along with an air stream.

In another embodiment of the present invention, an air blow chamber is provided on a downstream side of the moving direction of the flexible substrate in the substrate treatment chamber, and the surface of the flexible substrate which has been subjected to sandblasting is subjected to an air blow treatment.

In another embodiment of the present invention, a substrate cleaning chamber is provided on a downstream side of the moving direction of the flexible substrate in the substrate treatment chamber, and the flexible substrate which has been subjected to sandblasting is cleaned in the substrate cleaning chamber.

In another embodiment of the present invention, the flexible substrate is grounded in a moving path of the flexible substrate.

In another embodiment of the present invention, a plurality of members which hold the flexible substrate while moving along the moving path of the flexible substrate are provided in the substrate treatment chamber, and the plurality of members are placed at a distance from one another to a degree that the flexible substrate does not sag due to the injection of the air stream by the injection nozzle.

According to another aspect of the present invention, a method for producing a solar cell includes the steps of: placing a band-shaped flexible substrate in an apparatus in such a manner that the flexible substrate is delivered from a first end, passes through a substrate treatment region, and reaches a second end; and continuously forming minute unevenness on a surface of the flexible substrate by sandblasting in the substrate treatment region while the flexible substrate passes through the substrate treatment region.

According to another aspect of the present invention, a thin film solar cell includes: a substrate having a first surface; a transparent conductive film having a second surface, formed on the first surface of the substrate; and a semiconductor photoelectric structure for conducting photoelectric transfer, provided on the transparent conductive film so as to be in contact with the second surface of the transparent conductive film, wherein the first surface and the second surface have unevenness whose difference in height between convex portions and concave portions is around 0.1 to 0.5 $\mu$m.

Alternatively, a thin film solar cell includes: a substrate having a first surface; a reflecting electrode formed on the first surface of the substrate; a semiconductor photoelectric structure conducting photoelectric transfer, provided on the reflecting electrode; and a transparent electrode formed on the semiconductor photoelectric structure, wherein the first surface of the substrate and surfaces of the reflecting electrode and the semiconductor photoelectric structure have unevenness whose difference in height between convex portions and concave portions is around 0.1 to 0.5 $\mu$m.

According to another aspect of the present invention, a method for producing a thin film solar cell includes the steps of: continuously treating a flexible substrate by sandblasting to form minute unevenness on a surface of the flexible substrate, thereby forming a substrate provided with a first surface having unevenness whose difference in height between convex portions and concave portions is around 0.1 to 0.5 $\mu$m; forming a metal layer on the first surface of the substrate in such a manner that the unevenness of the first surface of the substrate is reflected on a surface of the metal layer, thereby forming a reflecting electrode; forming a plurality of semiconductor layers on the reflecting electrode in such a manner that the unevenness of the surface of the reflecting electrode is reflected on the surfaces of the semiconductor layers, thereby forming a semiconductor photoelectric structure conducting photoelectric transfer; and forming a transparent conductive film on the semiconductor photoelectric structure in such a manner that the unevenness of the surfaces of the semiconductors photoelectric structure is reflected on the surface of the transparent conductive film, thereby forming a transparent electrode, wherein the surfaces of the metal layer, the plurality of semiconductor layers and the transparent conductive film have unevenness whose difference in height between convex portions and concave portions is around 0.1 to 0.5 $\mu$m.

Hereinafter, the function of the present invention will be described.

According to the present invention, the unevenness on the surface of a substrate for a solar cell is formed by spraying minute abrasive grains with a count of #2000 or higher onto the surface of the substrate. The difference in height between convex portions and concave portions of the unevenness is small, i.e., 0.1 to 0.5 $\mu$m. Thus, smooth unevenness is obtained. Because of this, even when a thin film is directly formed on the surface of the substrate with the unevenness, the thin film is not likely to be cracked, making it unnecessary to fill the convex portions of the unevenness so as to make the unevenness smooth.

Furthermore, by optimizing the Haze factor, a solar cell with a conversion efficiency of 10% or higher can be formed on the substrate for a solar cell.

According to the present invention, since the minute unevenness is formed on the surface of the substrate for a solar cell by sandblasting, there is an advantage that the unevenness can be minutely controlled by the count of the abrasive grains, the injection distance, the injection pressure, and the like.

Sandblasting makes it possible to form the unevenness on the surface of the substrate at room temperature, and a high temperature of around 500° C. is not required, unlike the case where the unevenness is formed by an ordinary pressure CVD method. Therefore, the unevenness can be formed on reinforced glass by sandblasting, enabling the cost of a solar cell module to be reduced.

In the case where a metal substrate made of stainless steel or the like is used for a solar cell, the time required for increasing and decreasing the temperature of the substrate can be saved and the warping of the substrate can thereby be prevented by using sandblasting.

Furthermore, in the case where unevenness is formed by sandblasting on the surface of a metal substrate, scratches on the surface of the metal substrate can be smoothed by sandblasting. Because of this, an abrasion treatment of the surface of the metal substrate required for preventing the scratches on the surface from decreasing yield can be conducted simultaneously with the formation of the unevenness by sandblasting. In the case where such a metal substrate is used, a solar cell with the equivalent conversion efficiency can be formed at a lower cost, compared with the conventional example.

According to the present invention, the unevenness is formed on the surface of a substrate by using abrasive grains with a count of #2000 or higher, so that the unevenness becomes smooth. Because of this, even when a thin film is directly formed on the surface of the substrate with the unevenness, the thin film is not likely to be cracked, making it unnecessary to fill concave portions of the unevenness. Moreover, a defective layer caused by the conventional sandblasting can be prevented. Thus, the step of removing the defective layer by etching becomes unnecessary.

According to the present invention, the unevenness of the surface of the transparent conductive film formed on the substrate with the unevenness has an average difference in height between convex portions and concave portions of 0.1 to 0.5 μm, and the unevenness of the surface of the transparent conductive film is substantially the same as that of the surface of the glass substrate.

According to the present invention, the transparent conductive film is formed on the surface of the glass substrate with the unevenness by sputtering, so that the transparent conductive film can be formed along the unevenness of the surface of the glass substrate. Because of this, unevenness whose average difference in height between convex portions and concave portions is 0.1 to 0.5 μm and which is substantially the same as that of the surface of the glass substrate can be obtained on the surface of the transparent conductive film.

According to the present invention, ZnO or ITO is used as a material for the transparent conductive film. Therefore, unlike the case where unevenness is formed on the surface of a $SnO_2$ film, the transparent conductive film is not required to be as thick as 1 μm. The thickness of the transparent conductive film can be made around 200 nm, i.e., around ¼ to ⅕ of the conventional example.

According to the present invention, the band-shaped flexible substrate is held in such a manner that the substrate can be delivered from one end which is wound into a roll-shape and can be taken up by the other end which is also wound into a roll-shape, and the surface of the flexible substrate passing through the substrate treatment region in the moving path of the substrate is continuously subjected to sandblasting, whereby minute unevenness is formed on the surface of the substrate. Therefore, a substrate for a solar cell having a scattering reflective surface with unevenness suitable for an amorphous Si solar cell can be produced with good yield without using a high temperature treatment.

According to the present invention, regions for placing the one end and the other end wound into a roll-shape of the band-shaped flexible substrate, and the substrate treatment region for subjecting the flexible substrate to sandblasting are separated from each other as independent chambers. Therefore, the abrasive grains used for sandblasting in the substrate treatment region are prevented from adhering to the flexible substrate wound into a roll-shape before and after the surface treatment, and the used abrasive grains can be prevented from scattering and can be efficiently recovered.

According to the present invention, the air curtains are provided at the inlet and outlet portions of the substrate treatment chamber so as to partition the inside region from the outside region. Therefore, the abrasive grains can be prevented from adhering to the flexible substrate wound into a roll-shape before and after the surface treatment, and the used abrasive grains can be efficiently recovered.

According to the present invention, a plurality of injection nozzles spraying abrasive grains onto the surface of the flexible substrate along with an air stream are provided in the substrate treatment region in the direction normal to the moving direction of the flexible substrate. Therefore, sandblasting of the surface of the flexible substrate can be uniformly conducted in the width direction of the substrate.

According to the present invention, the surface of the flexible substrate which has been subjected to sandblasting is subjected to an air blow treatment in the air blow chamber provided on the downstream side of the substrate treatment chamber of the moving direction of the flexible substrate.

Therefore, the abrasive grains adhering to the portions of the flexible substrate treated by sandblasting can be removed before the treated portions are taken up into a roll-shape.

According to the present invention, the flexible substrate which has been subjected to sandblasting is cleaned in the substrate cleaning chamber provided on the downstream side of the substrate treatment chamber in the moving direction of the flexible substrate, wherein the abrasive grains adhering to the portions of the flexible substrate treated by sandblasting are removed before the treated portions are taken up into a roll-shape.

According to the present invention, the flexible substrate is grounded in the moving path of the flexible substrate. Therefore, the flexible substrate can be prevented from being charged by sandblasting.

According to the present invention, a plurality of roller members supporting the flexible substrate are provided in the substrate treatment chamber along the moving path of the flexible substrate in such a manner that the flexible substrate does not sag by the injection of an air stream from the injection nozzle. Therefore, treatment failure due to the sag of the flexible substrate caused during sandblasting can be avoided.

According to the present invention, using the substrate treatment apparatus holding the band-shaped flexible substrate in such a manner that the substrate can be delivered from one end wound into a roll-shape and can be taken up by the other end wound into a roll-shape, the surface of the flexible substrate passing through the substrate treatment region in the moving path of the substrate in the apparatus is continuously subjected to sandblasting, whereby a substrate for a solar cell with minute unevenness can be produced. Because of this, a substrate for a solar cell having a scattering reflective surface with unevenness suitable for an amorphous Si solar cell can be produced with good yield without using a high temperature treatment.

According to the present invention, unevenness is formed on the substrate for a solar cell forming a thin film solar cell by spraying minute abrasive grains with a count of #2000 or higher onto the surface of the substrate so that a difference in height between convex portions and concave portions of the unevenness becomes 0.1 to 0.5 μm. Therefore, the unevenness becomes smooth. Because of this, even when a thin film is directly formed on the surface of the substrate with unevenness, the thin film is not likely to be cracked, making it unnecessary to fill concave portions of the unevenness. Furthermore, by optimizing the Haze factor, a thin film solar cell having a conversion efficiency of 10% or higher can be obtained. The adverse effect of the unevenness on the thin film formed on the substrate surface can be reduced by setting the central line average roughness of the substrate surface at 20 to 200 nm.

According to the present invention, using the substrate treatment apparatus holding the band-shaped flexible substrate in such a manner that the substrate can be delivered from one end wound into a roll-shape and can be taken up by the other end wound into a roll-shape, the surface of the flexible substrate passing through the substrate treatment region is continuously subjected to sandblasting, whereby unevenness is formed on the surface of the substrate. Moreover, the reverse surface reflecting electrode film, the semiconductor photoelectric structure film for photoelectric transfer, and the transparent electrode film on the surface side are formed on the substrate surface, which has been subjected to sandblasting, in such a manner that the unevenness of the surface of the substrate is reflected on the respective films. The average difference in height between convex portions and concave portions of the unevenness of these films is in the range of 0.1 to 0.5 μm. In the step of treating the flexible substrate, minute unevenness is continuously formed on the surface of the flexible substrate passing through the substrate treatment region by sandblasting. Therefore, a thin film solar cell with high efficiency, using a substrate for a solar cell having a scatting reflective surface with unevenness, can be produced with good yield.

Thus, the invention described herein makes possible the advantages of (1) providing a substrate for a solar cell provided with a scattering reflective surface with unevenness suitable for an amorphous Si solar cell; (2) providing a method for producing a substrate for a solar cell in which unevenness suitable for an amorphous Si solar cell can be formed on the surface of a substrate at room temperature and high speed without using a high-temperature process; (3) providing a substrate treatment apparatus capable of producing a substrate for a solar cell provided with a scattering reflective surface with unevenness suitable for an amorphous Si solar cell with satisfactory yield without using a high-temperature treatment; (4) providing a thin film solar cell with high efficiency, using a substrate for a solar cell provided with a scattering reflective surface with unevenness; and (5) providing a method for producing a thin film solar cell with satisfactory yield, which is capable of producing a solar cell with high efficiency using a substrate for a solar cell provided with a scattering reflective surface with unevenness.

These and other advantages of the present invention will become apparent to those skilled in the art upon reading and understanding the following detailed description with reference to the accompanying figures.

DESCRIPTION OF THE PREFERRED EMBODIMENTS

Figure 1A:
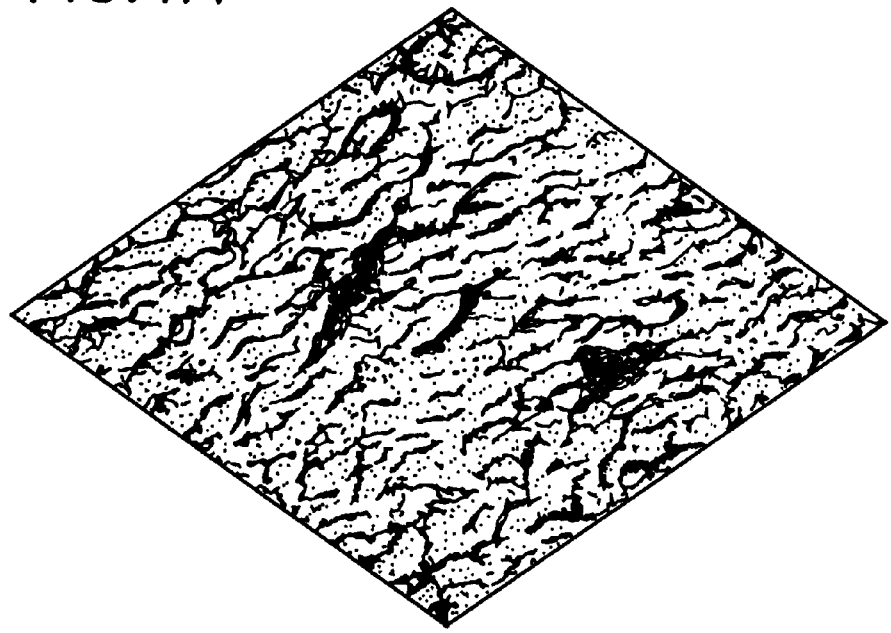
FIG. 1A shows an STM image of the surface of a substrate for a solar cell with a transparent conductive film formed by a method for producing a substrate for a solar cell according to the present invention.

Hereinafter, the present invention will be described by way of illustrative examples.

According to the present invention, unevenness is directly formed on a scattering reflective surface of a glass substrate for a solar cell by sandblasting, whereby the unevenness is made minute and the cost of the cell is reduced.

More specifically, conventionally, a $SnO_2$ film is formed on a substrate for a solar cell and unevenness is formed on the $SnO_2$ film, whereby the substrate is provided with unevenness. According to this method, there is a problem that a slight change in conditions of controlling the growth of the $SnO_2$ film is likely to cause variation in the unevenness on the surface of the substrate for a solar cell.

In contrast, the sandblasting of the present invention has an advantage that unevenness is minutely controlled. Furthermore, according to the sandblasting, the unevenness can be formed on the surface of a substrate at room temperature. Thus, the sandblasting does not require a high temperature of around 500° C., unlike the case where unevenness is formed by an ordinary pressure CVD, so that unevenness can be formed on reinforced glass. Because of this, a thin film solar cell can be directly formed on reinforced glass, which makes it unnecessary for a thin film solar cell module to have a double structure of reinforced glass and non-reinforced glass. As a result, the production cost can be reduced.

Furthermore, a transparent conductive film is not required to be thick so as to obtain large unevenness. Therefore, the transparent conductive film may have a thickness of around 200 nm, i.e., ¼ to ⅕ of the conventional example.

In the case where a metal substrate such as a stainless steel substrate is used, the time required for increasing and decreasing the temperature of the substrate can be saved and the substrate can be prevented from warping by forming unevenness on the surface of the substrate at room temperature by sandblasting.

Furthermore, since metal substrates have scratches on their surfaces, it is required to subject the substrate to a grinding treatment for the purpose of improving yield. However, according to the sandblasting for forming the unevenness, the scratches over the entire surface of the substrate can be smoothed simultaneously with the formation of unevenness. Therefore, the unevenness can be very efficiently formed on the surface of the metal substrate. By using such metal substrates, solar cells can be produced at lower cost with efficiency equal to or higher than that of the conventional example.

When the unevenness is formed by the conventional sandblasting, a substrate is given large impact. Therefore, it is required that a defective layer caused by the sandblasting be removed by etching. According to the sandblasting of the present invention, abrasive grains with a count of #2000 or higher are sprayed onto the surface of a substrate along with an air stream, so that the impact against the substrate is small, which can prevent the formation of the defective layer as described above and makes it unnecessary to etch the defective layer. Furthermore, it is required to deposit $SiO_2$ in concave portions of the unevenness formed by the conventional sandblasting so that the concave portions become smooth. In contrast, according to the present invention, the unevenness is smoothed by using the abrasive grains with a count of #2000 or higher, so that it is not required to fill the concave portions.

Figure 1B:
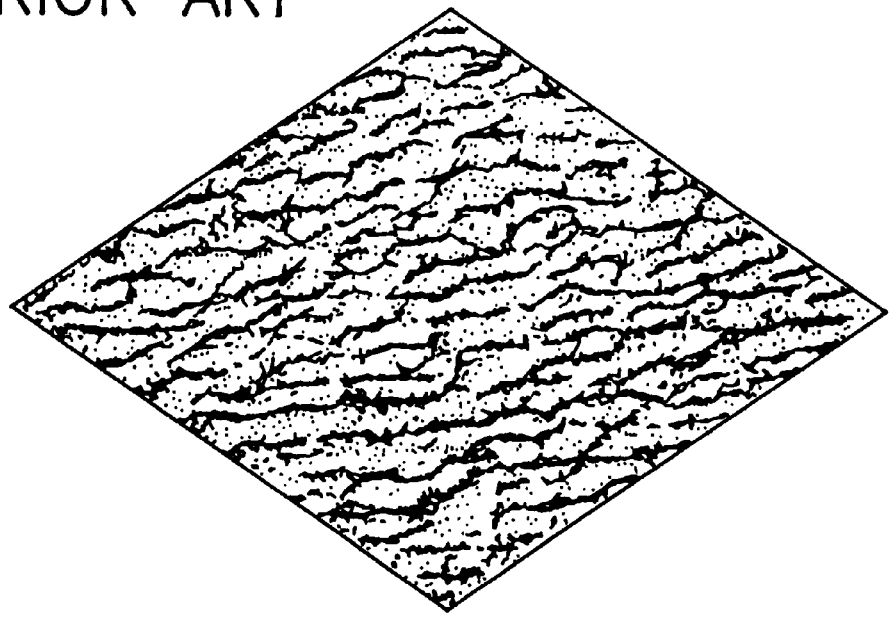
FIG. 1B shows an STM image of the surface of a conventional transparent conductive film with unevenness.

FIG. 1A shows an STM image of the surface of a substrate for a solar cell with a transparent conductive film formed by a method for producing a substrate for a solar cell according to the present invention; FIG. 1B shows an STM image of the surface of a conventional transparent conductive film with unevenness.

The conditions of forming unevenness on the surface of a substrate by sandblasting according to the present invention depend mainly upon the count of abrasive grains, the injection distance (i.e., the distance from the tip end of an injection nozzle to the surface of a substrate), and the injection pressure (i.e., the pressure of the abrasive grains).

Figure 2:
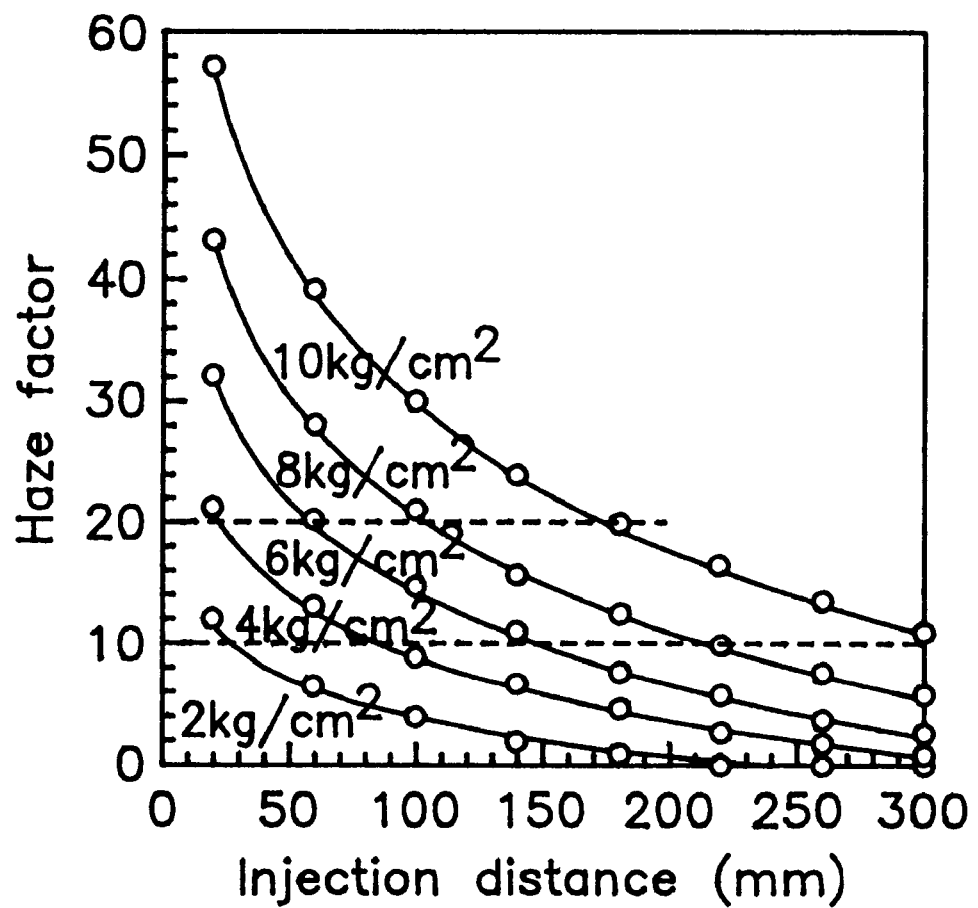
FIG. 2 is a graph showing the relationship between a Haze factor, an injection pressure, and an injection distance in the case where a substrate is subjected to dry sandblasting, using abrasive grains with a count of #3000.

FIG. 2 is a graph showing the relationship between a Haze factor, an injection pressure, and an injection distance in the case where a substrate is subjected to dry sandblasting, using abrasive grains with a count of #3000. The Haze factor is a ratio between the luminous intensity of straight-ahead light and that of scattering light which are transmitted through a substrate, i.e., an index representing light scattering. When the Haze factor is high, light scattering increases and the optical path length of light inside a solar cell increases. Light scattering increases at an interface where the difference in the light refractive index is large. (The refractive indices are 1.5 for glass, 1.9 for a transparent conductive film, and 3.5 for an amorphous film). The light scattering will be described with reference to FIG. 3.

Figure 3:
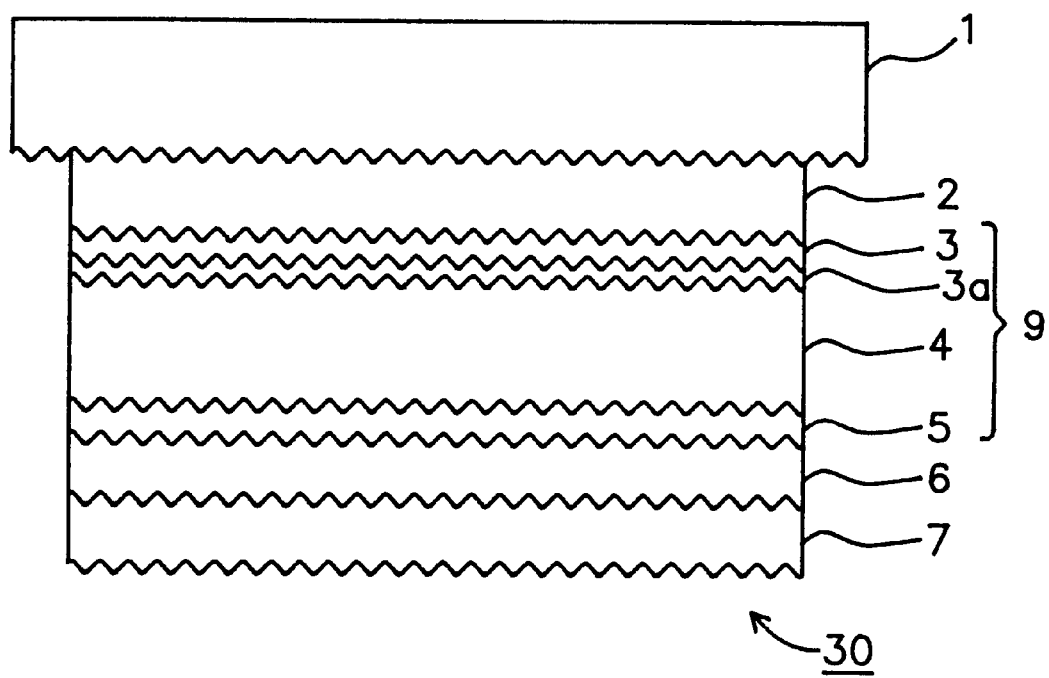
FIG. 3 shows a cross-sectional structure of a thin film solar cell of Example 3 according to the present invention.

FIG. 3 shows a cross-sectional structure of a thin film solar cell 30 of the present invention. The thin film solar cell 30 includes a glass substrate 1 having unevenness on its surface, a transparent conductive film 2, and a layered structure for photoelectric transfer 9. The layered structure for photoelectric transfer 9 includes a p-type amorphous silicon layer (p-layer) 3, a composition change layer (b-layer) 3a, an i-type amorphous silicon layer (i-layer) 4, and an n-type amorphous silicon layer (n-layer) 5. A ZnO film 6 which forms a reverse surface electrode and an Ag film 7 which forms a reverse surface metal reflecting electrode are formed on the n-type amorphous silicon layer 5.

Light is largely refracted at the interface between the transparent conductive film 2 and the p-type amorphous silicon layer 3. Thus, the unevenness at the interface is most important. Since light scatters at the interface, it obliquely travels through the i-type amorphous silicon layer 4. In this case, the optical path length becomes longer, compared with the case where light vertically travels through the i-type amorphous silicon layer 4 due to the absence of the unevenness at the interface. Because of this, the amount of light absorbed by a solar cell increases and an output current increases.

The output current tends to increase along with the increase in the Haze factor, and is saturated at the Haze factor of about 40 to 50. However, when the Haze factor increases, the unevenness on the surface of a glass substrate also increases in magnitude, and the magnitude of the unevenness becomes larger than the thickness (0.3 to 0.5 $\mu$m) of semiconductor layers. Therefore, a short-circuit is likely to occur between the transparent conductive film 2 and the reverse surface metal reflecting electrode 7, resulting in a decrease in yield. Because of this, the Haze factor is preferably in the range of around 10 to around 20. As shown in FIG. 2 (region surrounded by a broken line), a substrate having a desired Haze factor can be obtained by appropriately selecting the injection pressure and the injection distance. As is understood from FIG. 2, to obtain a desired Haze factor of a substrate, it is preferable to set the injection pressure at around 2 to 10 kg/cm$^2$ and the injection distance at around 40 to 300 mm.

Figure 4:
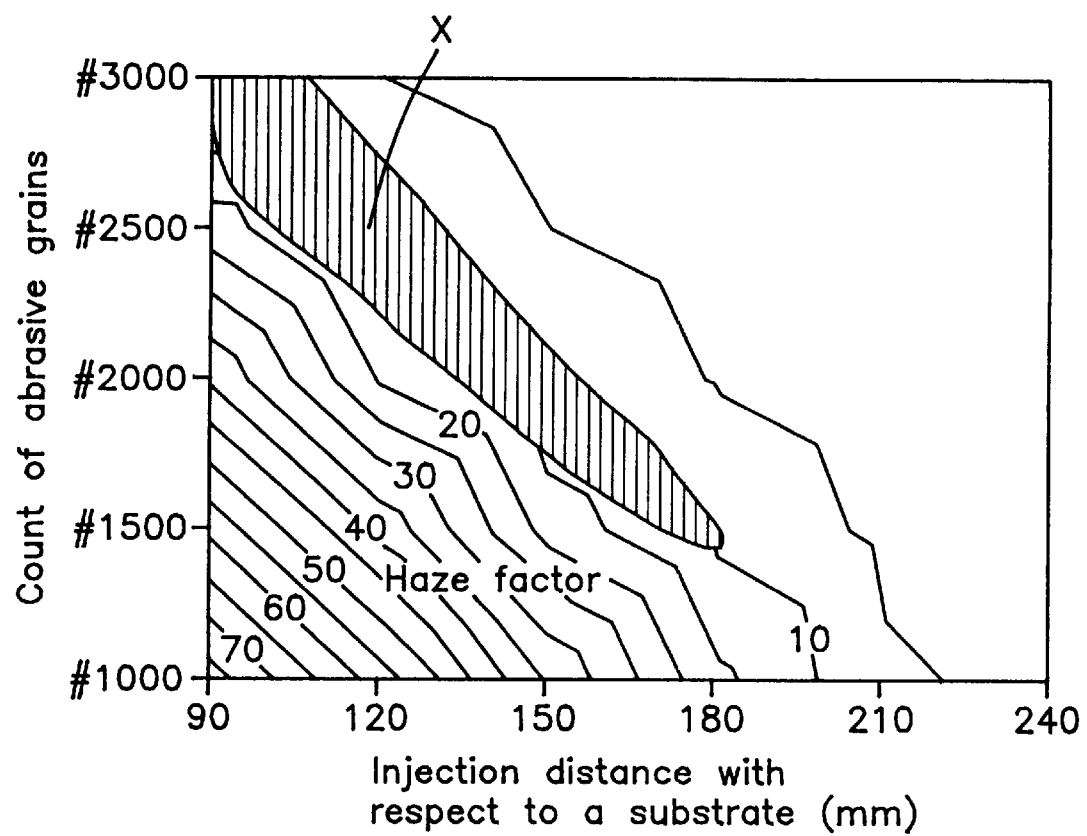
FIG. 4 is a graph showing the relationship between the count of abrasive grains used in the present invention and the injection distance with respect to a substrate in a 2-dimensional coordinate, using a Haze factor as a parameter, and shows a range X in which cell characteristics of 10% or more conversion efficiency can be obtained in the 2-dimensional coordinate.

FIG. 4 shows the relationship among the count of the abrasive grains, the injection distance, and the Haze factor. In the shaded region, the Haze factor is around 10 to 20. In this region, satisfactory solar cell characteristics having a conversion efficiency of 10% or higher can be obtained.

In FIG. 4, when the abrasive grains have a count of around #1500, there is no region where satisfactory cell characteristics with a conversion efficiency of 10% or higher of a solar cell can be obtained, irrespective of the Haze factor. The reason for this is as follows: When the count of the abrasive grains increases, the surface state obtained by the treatment using the abrasive grains becomes different even at the same Haze factor and the unevenness to be formed on the substrate surface also increases, whereby solar cell characteristics decrease. For this reason, the range of the Haze factor in which cells with satisfactory efficiency are obtained gets widened, when the abrasive grains with a count of around #3000 are used. As is understood from FIG. 4, cells with high efficiency can be obtained by controlling the count of the abrasive grains and the injection distance.

FIG. 4 shows the case where unevenness is formed on a glass substrate. In the case where a stainless steel substrate or a film made of a polymer, etc. is used as a substrate, the count of the abrasive grains, the Haze factor, and the range of the injection distance are different from those in the case of using a glass substrate. The reason for this is as follows:

When a stainless steel substrate or a film of a polymer, etc. is used as a substrate, a metal electrode made of Ti, Ag, Al, or the like is formed on the surface of a substrate which has been provided with unevenness. Therefore, the unevenness formed on the substrate is not clearly formed on the amorphous films, which then requires large unevenness to be formed on the substrate. For example, the difference in height between convex portions and concave portions is desirably around 0.2 $\mu$m for a glass substrate and around 0.3 to 0.4 $\mu$m for a stainless steel substrate.

Figure 5:
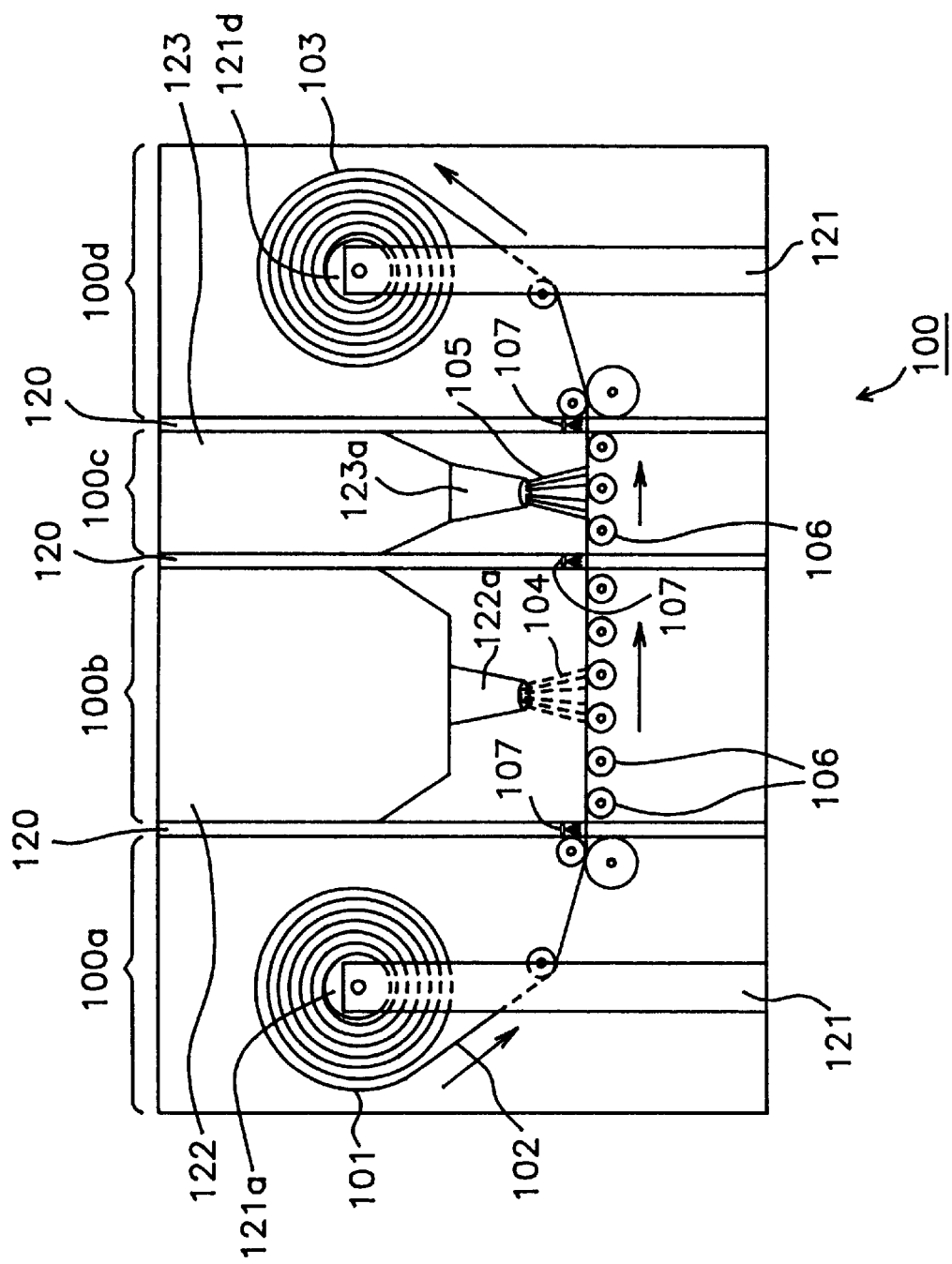
FIG. 5 schematically shows a structure of a treatment apparatus of a substrate for a solar cell of Example 4 according to the present invention.

Hereinafter, referring to FIG. 5, the basic principle of a substrate treatment apparatus 100 of the present invention will be described.

Using a roll-to-roll mechanism, the substrate treatment apparatus 100 of the present invention supplies a band-shaped flexible substrate 102 to a treatment region 100b and discharges the flexible substrate 102 from the treatment region 100b. In the treatment region 100b, the flexible substrate 102 is treated by sandblasting. The sandblasting allows minute unevenness whose difference in height between convex portions and concave portions is around 100 to 500 nm to be formed on the flexible substrate 102.

The substrate treatment apparatus 100 has roll placement regions 100a and 100d, for example, on the left and right sides as one faces the apparatus 100. The substrate treatment region 100b is provided between the roll placement regions 100a and 100d. These regions are separated as independent chambers by partitioning members 120. The inside and outside of the substrate treatment region (substrate treatment chamber) 100b are partitioned by air curtains 107 at inlet and output portions of the substrate treatment region 100b.

In the substrate treatment chamber 100b, a plurality of injection nozzles 122a are arranged side-by-side in the direction normal to the moving direction of the flexible substrate 102. Moreover, in the substrate treatment chamber 100b, the flexible substrate 102 is moved by a plurality of guide rollers 106 in such a manner that the flexible substrate 102 does not sag by injection of abrasive grains. An air blow treatment region or a substrate cleaning chamber 100c is provided on the downstream side of the substrate treatment chamber 100b.

Furthermore, the substrate treatment apparatus 100 has a structure in which the flexible substrate 102 is grounded at least during its operation.

As described above, the flexible substrate 102 is supplied to the substrate treatment region 100b and is discharged therefrom by the roll-to-roll mechanism, and the surface of the flexible substrate 102 is directly treated by sandblasting in the treatment region 100b, whereby minute unevenness whose difference in height between convex portions and concave portions is around 100 to 500 nm (0.1 to 0.5 $\mu$m) can be continuously formed on the surface of the band-shaped flexible substrate 102. By using a substrate with such minute unevenness for a thin film solar cell, the efficiency of the cell can be improved and the cost thereof can be lowered.

The surface treatment by sandblasting can form unevenness which is smaller than that obtained by a commonly used method for forming unevenness on the surface of a reverse face reflecting metal film and which makes it difficult for a short-circuit to occur inside of solar cells. The reason for this is as follows: According to the conventional method, unevenness is formed on the surface of a reverse surface reflecting metal film during growth of the metal film, followed by an annealing treatment, whereas according to the sandblasting, unevenness is formed on the surface of a substrate by impact of abrasive grains injected onto the surface.

Furthermore, the sandblasting can be conducted at room temperature under ordinary pressure, so that unevenness can be formed on the surface of a substrate in a short period of time.

Since scratches on the surface of a metal substrate decreases the yield of a solar cell, it is generally required to conduct an abrasion treatment before forming unevenness on the surface of the metal substrate. According to the sandblasting of the present invention, unevenness can be formed on the surface of a substrate, and at the same time, scratches over the entire surface thereof are smoothed. Thus, this treatment is very efficient. The use of such a substrate treatment apparatus enables solar cells to be formed at lower cost with the equivalent efficiency, compared with the conventional example.

EXAMPLE 1

A method for forming a substrate for a thin film solar cell of Example 1 according to the present invention will be described.

Unevenness can be formed on the surface of any substrate by sandblasting, as long as it has a certain degree of hardness. For example, the surfaces of glass, metal, ceramics, plastics, carbon, and the like can be treated by sandblasting so as to have unevenness, while it is difficult to treat the surfaces of soft materials such as rubber. In the present example, the case where a glass substrate is treated will be described.

Figure 6:
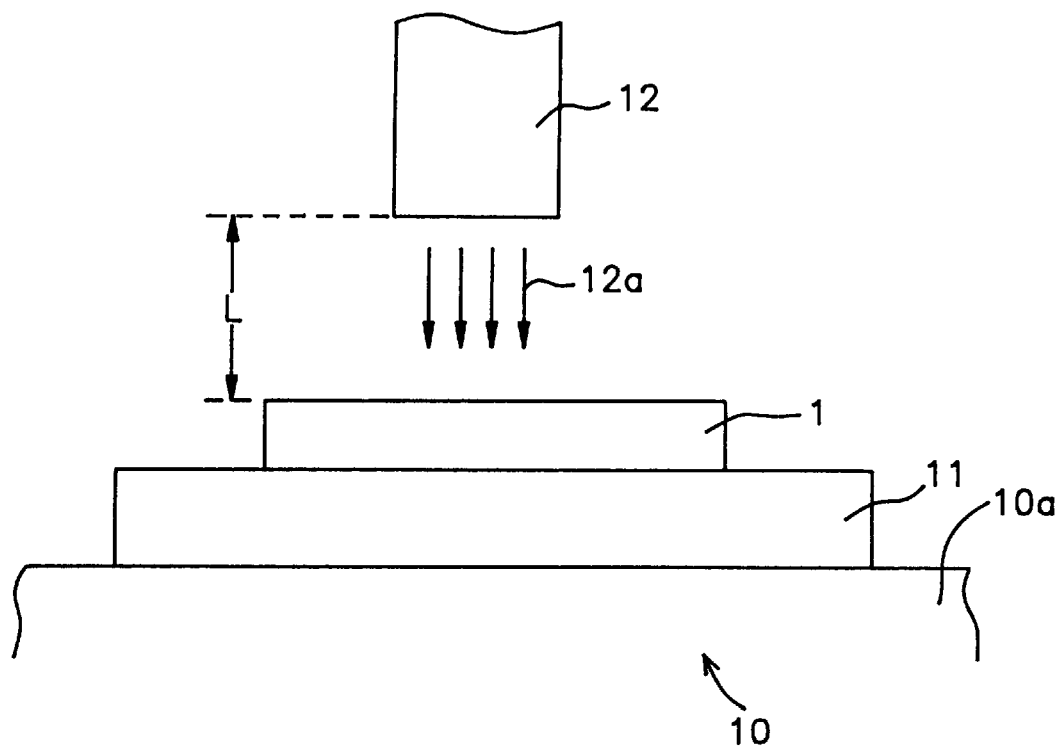
FIG. 6 schematically shows a structure of a treatment apparatus used for a method for producing a substrate for a thin film solar cell of Example 1 according to the present invention.

FIG. 6 schematically shows the structure of a treatment apparatus 10 used for forming the substrate for a thin film solar cell of Example 1. As shown in this figure, the treatment apparatus 10 includes a plate 11 for a substrate treatment movably provided with respect to an apparatus body 10a and an injection nozzle 12 for injecting abrasive grains along with an air stream 12a, arranged above the plate 11 for a substrate treatment. Although the diameter of the injection nozzle 12 is usually set at around 7 mm, it can be set in accordance with the size and treatment speed of a substrate to be treated.

Next, a method for producing the substrate for a thin film solar cell of the present example, using the above-mentioned apparatus, will be described.

First, a glass substrate 1, such as a reinforced glass substrate, is placed on the plate 11 for a substrate treatment, and the plate 11 for a substrate treatment is moved in a predetermined direction while an air stream 12a containing abrasive grains is sprayed onto the surface of the glass substrate 1 from the injection nozzle 12. Herein, abrasive grains with a count of #2000 or higher, desirably around #3000 are used. There are various kinds of abrasive grains which can be used in the present example. For example, abrasive grains made of alumina, white alumina, carbon random, or the like may be used.

In Example 1, the injection pressure of the air stream injected from the injection nozzle 12 is set at around 3 to 4 kg/cm$^2$ and the injection amount of the abrasive grains is set at around 50 g/min. An injection distance L, i.e., the distance from the tip end of the injection nozzle 12 to the surface of the glass substrate 1 is set at around 10 cm, and an injection angle, i.e., the angle at which the air stream is injected onto the surface of the glass substrate 1 from the injection nozzle 12 is set at 90 degrees. Furthermore, the moving speed of the plate 11 for a substrate treatment is set at 250 mm/min.

In the case where a commonly-used soda glass substrate is treated by sandblasting under the above-mentioned treatment parameters, a substrate for a solar cell with a magnitude of unevenness on the surface, i.e., the difference in height between convex portions and concave portions, is around 200 nm and a central line average roughness of around 60 nm can be obtained. The central line average roughness represents the degree of the unevenness on the substrate surface. As the substrate surface becomes smoother, the central line average roughness becomes smaller. By setting the central line average roughness on the substrate surface in a range of 20 nm to 200 nm, adverse effects on a thin film formed on the substrate surface by the unevenness can be reduced.

Numerical values of treatment parameters, etc. described in Example 1 are exemplary, and it is required to set optimum parameters in accordance with a substrate material in order to obtain unevenness with a maximum magnitude of around 200 nm, desirably around 150 nm.

EXAMPLE 2

Hereinafter, a method for forming a substrate for a thin film solar cell of Example 2 according to the present invention will be described. In this example, a metal substrate is treated so as to be used for forming a thin film solar cell.

In general, in order to use a metal substrate made of stainless steel, etc. for a solar cell, it is required to eliminate scratches on the surface thereof. For this purpose, the surface of a substrate is generally subjected to an abrasion treatment before being treated so as to have unevenness. This treatment enables the production yield of a solar cell to increase. After the abrasion treatment, metal such as Ag is deposited on the substrate, followed by heat treatment in such a manner that the surface thereof has unevenness.

In contrast, according to the method for producing a substrate for a solar cell of Example 2 of the present invention, while the surface of a metal substrate is subjected to an abrasion treatment, unevenness can be formed on the surface.

More specifically, for example, a stainless steel substrate is placed on the plate 11 for a substrate treatment on the treatment apparatus 10 shown in FIG. 6, and the stainless steel substrate is subjected to sandblasting in the same manner as in Example 1. The conditions for sandblasting of Example 2 are different from those of Example 1 in that the injection pressure of an air stream from the injection nozzle is set at around 2 to 3 kg/cm$^2$ and the injection amount of abrasive grains is set at around 20 g/min. The other parameters are set to be the same as those of Example 1.

By treating the stainless steel substrate under such conditions, a substrate for a solar cell, which has a surface with unevenness whose difference in height between convex portions and concave portions is about 100 to 500 nm (0.1–0.5 μm), can be produced.

EXAMPLE 3

Hereinafter, a thin film solar cell using the substrate for a solar cell of Example 1 and a method for producing the same will be described.

In this example, a glass substrate is used as a substrate for a solar cell. However, substrates made of other materials, such as a light-transparent polymer and stainless steel, may also be used.

FIG. 3 shows a cross-sectional structure of a thin film solar cell 30 of Example 3. The thin film solar cell 30 includes the glass substrate 1 of Example 1 with unevenness formed on its surface. The maximum height of the unevenness on the surface of the glass substrate 1 is around 0.2 μm, and the width of convex portions and concave portions of the unevenness is 300 to 600 nm. When the unevenness on the surface of the glass substrate 1 has a difference in height between convex portions and concave portions of around 0.1 to 0.5 μm, the effect of the present invention can be obtained.

A transparent conductive film 2, a p-type amorphous silicon layer (p-layer) 3, a composition change layer (b-layer) 3a, an i-type amorphous silicon layer (i-layer) 4, and an n-type amorphous silicon layer (n-layer) 5 are then layered on the glass substrate 1 in that order. Furthermore, a ZnO film 6 which forms a reverse surface electrode and a Ag film 7 which forms a reverse surface metal reflecting electrode are formed on the n-type amorphous silicon layer 5 in that order. The glass substrate 1 is then positioned on the side of incident light.

Next, a method for producing the above-mentioned thin film solar cell 30 will be described.

First, the glass substrate 1 is provided with unevenness and is cleaned in the same manner as in Example 1. The reason why the glass substrate 1 is cleaned is that a powder of abrasive grains of alumina or the like remains on the surface of the glass substrate 1 which has been subjected to sandblasting. An ultrasonic cleaning treatment using pure water is utilized for such cleaning. The cleaning treatment is not particularly limited. However, if a substrate has no oil stain before sandblasting, a simple cleaning treatment suffices for the substrate; otherwise, a special cleaning treatment may be required.

Next, the transparent conductive film 2 (e.g., thickness: around 200 nm) is formed by sputtering on the surface of the glass substrate 1 which has been subjected to sandblasting. The thickness of the transparent conductive film 2 is preferably in the range of about 200 to 500 nm. The unevenness of the surface of the glass substrate 1 is reflected on the surface of the transparent conductive film 2, and consequently, unevenness having a difference in height between convex portions and concave portions of around 0.1 to 0.5 μm is formed on the transparent conductive film 2. The transparent conductive film 2 may be formed by a CVD method, a vapor deposition method, etc. As a constituent material for the transparent conductive film 2, ITO, ZnO, or the like may be used. It is not preferable in terms of the characteristics of solar cells that the transparent conductive film 2 be composed of ITO alone. Therefore, in the case where ITO is used for the transparent conductive film 2, the surface thereof should be thinly coated with ZnO or the like.

According to the conventional method for forming unevenness on the surface of a transparent conductive film, conditions for forming the transparent conductive film are set in such a manner that the film will have unevenness. In Example 3, unevenness has already been formed on the surface of the glass substrate 1, so that the conditions for forming the transparent conductive film 2 are not required to be set particularly in such a manner that the film 2 will have unevenness. This improves the reproducibility of the unevenness to be formed on the surface of the transparent conductive film 2 and the surface resistance thereof.

After the transparent conductive film 2 is formed, the p-type amorphous silicon layer (p-layer) 3, a composition change layer (b-layer) 3a, an i-type amorphous silicon layer (i-layer) 4, and an n-type amorphous silicon layer (n-layer) 5 are successively formed by a plasma CVD apparatus.

The p-type amorphous silicon layer 3 has an optimum thickness in accordance with the magnitude of the unevenness. When the Haze factor is around 15, the p-type amorphous silicon layer 3 may have a thickness of around 15 nm. When the Haze factor is around 30, the p-type amorphous silicon layer 3 is required to have a thickness of around 18 to 20 nm. The thickness of the i-type amorphous silicon layer 4 is set at 500 nm, and that of the n-type amorphous silicon layer 5 is set at 30 nm. The conditions for forming each of the amorphous silicon layers are exemplified in the following Table 1.

TABLE 1

|  | Substrate temperature (° C.) | Power (W/cm$^2$) | Pressure (Torr) | Gas flow rate (sccm) |
| --- | --- | --- | --- | --- |
| p-layer | 170 | 0.5 | 0.25 | SiH$_4$:1, H$_2$:100, B$_2$H$_6$:0.01 |
| b-layer | 170 | 0.05 | 0.25 | SiH$_4$:32, H$_2$:30 CH$_4$:32 to 0 |
| i-layer | 170 | 0.1 | 0.12 | SiH$_4$:42, H$_2$:14 |
| n-layer | 170 | 0.5 | 0.25 | SiH$_4$:1, H$_2$:100, PH$_3$:0.01 |

Then, the ZnO film 6 (thickness: 60 nm) is formed by sputtering to form a reverse surface electrode on the surface of the n-type amorphous silicon layer 5. Finally, the Ag film 7 (thickness: 500 nm) is formed by sputtering as a reverse surface metal reflecting electrode on the surface of the reverse surface electrode 6.

Figure 7:
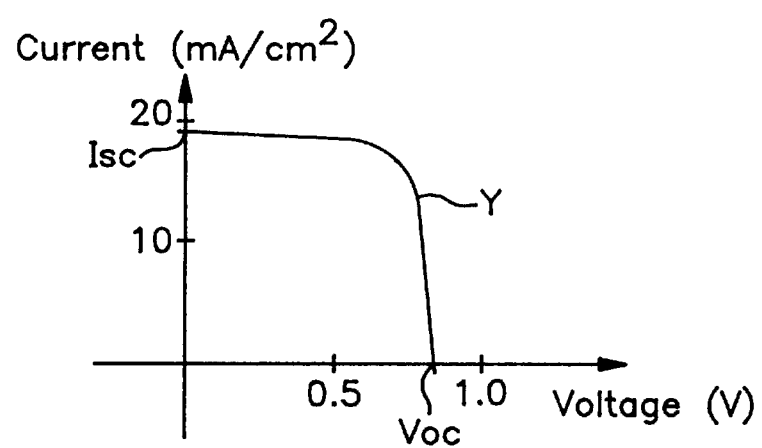
FIG. 7 is a graph showing output characteristics of the thin film solar cell of Example 3 according to the present invention.

FIG. 7 shows the output characteristics of the solar cell produced as described above. For the output characteristics, a short-circuit current $I_{SC}$ of 19.4 mA/cm$^2$, a release voltage $V_{OC}$ of 0.86 volts, a curve factor FF of a curve Y of 0.72, and a conversion efficiency η of 12.0% are obtained.

These characteristics indicate an improved solar cell in comparison with cell characteristics obtained by forming unevenness, using the conventional transparent conductive film. The short-circuit current in the present example is higher than that of the conventional example.

EXAMPLE 4

In the present example, a method for forming a substrate with unevenness for a thin film solar cell, utilizing a roll-to-roll mechanism, will be described.

Referring again to FIG. 5, a substrate treatment apparatus 100 used for a substrate treatment utilizing a roll-to-roll mechanism will be described in more detail. As shown in this figure, the substrate treatment apparatus 100 includes a roll-to-roll mechanism which supplies a band-shaped flexible substrate 102 to a treatment region 100b and discharges the flexible substrate 102 therefrom. In the treatment region 100b, the flexible substrate 102 is treated by sandblasting. The sandblasting allows minute unevenness having a difference in height between convex portions and concave portions of around 100 to 500 nm to be formed on the flexible substrate 102.

The substrate treatment apparatus 100 has roll placement regions 100a and 100d, for example, on the left and right sides as one faces the apparatus 100. The substrate treatment region 100b is provided between the role placement regions 100a and 100d. An air blow treatment region 100c, where the flexible substrate 102 is subjected to an air blow treatment, is provided between the substrate treatment region 100b and the roll placement region 100d. The regions 100a, 100b, 100c, and 100d are separated by partitioning members 120 so that they become independent chambers. Hereinafter, the regions 100a, 100d, 100b, and 100c will be referred to as a delivery roll chamber 100a, a take-up roll chamber 100d, a substrate treatment chamber 100c, and an air blow chamber 100b.

An opening portion through which the delivery roll chamber 100a communicates with the substrate treatment chamber 100b, an opening portion through which the substrate treatment chamber 100b communicates with the air blow chamber 100c, and an opening portion through which the air blow chamber 100c communicates with the take-up roll chamber 100d respectively have air curtains 107.

The delivery roll chamber 100a is provided with a delivery reel 121a rotatably supported by a support member 121, and the delivery reel 121a is wound with one side of the flexible substrate 102 to form a delivery roll 101. The take-up roll chamber 100d is provided with a take-up reel 121d rotatably supported by another support member 121, and the take-up reel 121d is wound with the other side of the flexible substrate 102 to form a take-up roll 103.

A plurality of guide rollers 106 for guiding the moving flexible substrate 102 are provided in the substrate treatment chamber 100b in the moving direction of the flexible substrate 102. The guide rollers 106 are positioned at a distance from each other in such a manner that the flexible substrate 102 does not sag by sandblasting.

A sandblasting device 122 is provided above the guide rollers 106, which injects abrasive grains 104 along with an air stream. The sandblasting device 122 has a plurality of injection nozzles 122a which are arranged in the direction normal to the moving direction of the flexible substrate 102 over the width of the flexible substrate 102.

The air blow chamber 100c is also provided with a plurality of guide rollers 106 for guiding the moving flexible substrate 102 in the moving direction of the flexible substrate 102. An air blowing device 123 for blowing air 105 downward through an air nozzle 123a is provided above the guide rollers 106. The air blow chamber 100c is provided on the downstream side of the substrate treatment chamber 100b in the substrate treatment apparatus 100 of Example 4. However, a substrate cleaning chamber may be provided in place of the air blow chamber 100c, which has a cleaning liquid tank containing pure water or the like and is capable of cleaning the surface of a substrate which has been subjected to sandblasting.

Furthermore, the substrate treatment apparatus 100 has a structure in which the flexible substrate 102 is grounded at least during operation.

Next, the effects of the present example will be described.

In the case where a metal substrate made of stainless steel or the like is used for a solar cell, the metal substrate is generally subjected to a grinding treatment in order to eliminate scratches thereon. Such a treatment serves to improve yield. Moreover, in order to provide the surface of a substrate with unevenness, it is required that a metal film made of Ag or the like be formed on the substrate, followed by a heat treatment.

In contrast, the substrate treatment apparatus of the present invention makes it possible to subject the surface of a substrate to the grinding treatment while forming unevenness on the substrate.

In the substrate treatment apparatus 100, the flexible substrate 102 is moved from the delivery roll chamber 100a to the take-up roll chamber 100d via the substrate treatment chamber 100b and the air blow chamber 100c. At this time, the flexible substrate 102 is continuously subjected to sandblasting in the substrate treatment chamber 100b, and the abrasive grains 104 adhering to the treated portions of the flexible substrate 102 are removed in the air blow chamber 100c.

Because of the above-mentioned structure, unevenness can be formed on the surface of a substrate by sandblasting efficiently. Furthermore, the unevenness formed on the surface of the substrate become minute due to sandblasting.

In the substrate treatment apparatus 100, the delivery roll chamber 100a, the take-up roll chamber 100d, and the substrate treatment chamber 100b are separated as independent chambers, respectively. Therefore, the abrasive grains 104 with a count of tens of $\mu$m used in the substrate treatment chamber 100b can be prevented from adhering to the surface of the flexible substrate 102 in a roll state and can be effectively collected for reuse.

Furthermore, the air curtains 107 are provided at the inlet and outlet portions of the substrate treatment chamber 100b, whereby the inside of the substrate treatment chamber 100b is partitioned from the outside thereof. This structure is useful for preventing the abrasive grains 104 from adhering to the surface of the flexible substrate 102 in a roll state and effectively collecting the abrasive grains 104.

Furthermore, since the air blow chamber 100c is provided on the downstream side of the substrate treatment chamber 100b, the abrasive grains 104 adhering to the treated portions of the flexible substrate 102 can be removed before the treated portions of the substrate 102 are sent to the take-up roll chamber 100d.

Furthermore, a plurality of guide rollers 106 guiding the flexible substrate 102 are provided at a distance from each other in the substrate treatment chamber 100b in such a manner that the substrate 102 does not sag during sandblasting. Therefore, the substrate 102 is prevented from sagging which may cause treatment failure.

In Example 4, conditions of sandblasting are set as follows.

As the abrasive grains 104, those made of alumina, white alumina, carbon random, or the like with a count of #2000 or higher, desirably #3000 are used. The diameter of the injection nozzle 122a of the sandblasting device 122 is typically set at around 7 mm, and the number of the injection nozzles 122a is appropriately set in accordance with the size of the substrate to be treated and the treatment speed.

Furthermore, the injection pressure of the air stream blown from the injection nozzle 122a is set at around 2 to 3 kg/cm$^2$, and an injection distance, i.e., the distance from the tip end of the injection nozzle 122a to the surface of the flexible substrate 102 is set at around 8 cm. An injection angle, i.e., the angle at which the air stream is injected onto the surface of the flexible substrate 102 from the injection nozzle 122a is set at 90 degrees. A delivery speed of the roll 121a, i.e., the moving speed of the flexible substrate 102 is set at 250 mm/min, and the amount of the abrasive grains 104 injected from each injection nozzle 122a is set at around 20 g/min. A substrate for a solar cell can be produced by treating a stainless steel substrate under these conditions.

EXAMPLE 5

Next, a method for producing a thin film solar cell using the substrate treatment apparatus 100 of Example 4 will be described. In Example 5, a stainless steel substrate is used as a substrate for a thin film solar cell. However, as is appreciated, other metal substrates or polymer substrates may be used.

Figure 8:
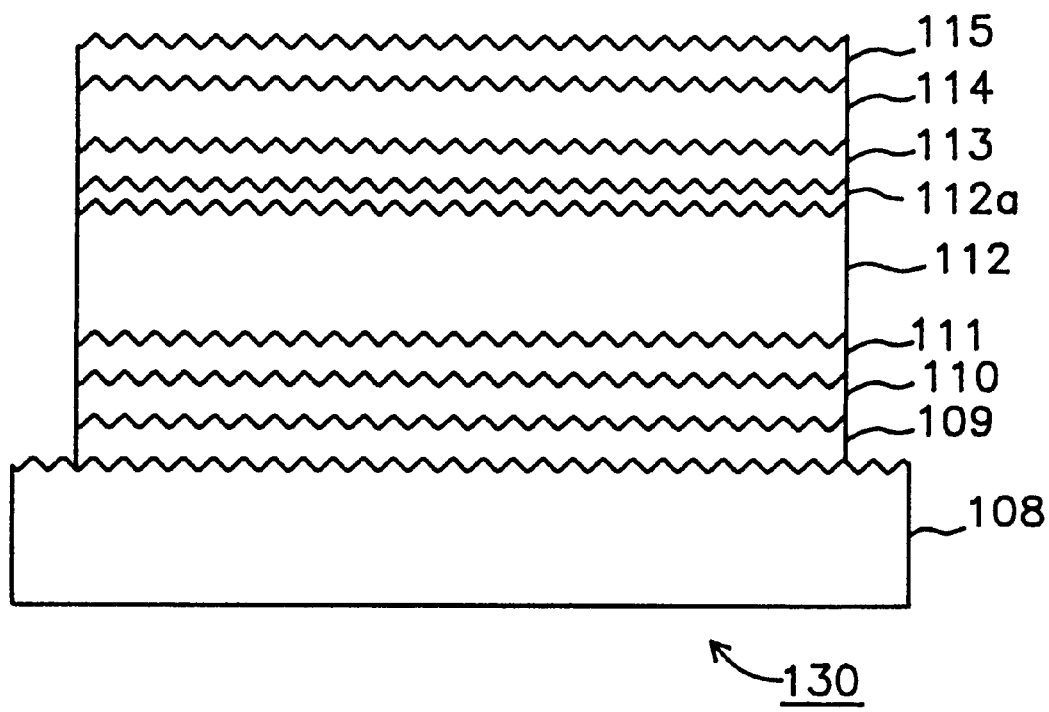
FIG. 8 shows a cross-sectional structure of a thin film solar cell produced by the method of Example 5.

FIG. 8 is a cross-sectional view showing a structure of a thin film solar cell 130 produced by the method of the present example. The thin film solar cell 130 includes a stainless steel substrate 108 provided with unevenness by the substrate treatment apparatus 100 of Example 4.

A metal reflecting electrode 109 and a transparent conductive film 110 are formed on the stainless steel substrate 108 in that order. An amorphous silicon n-layer 111, an amorphous silicon i-layer 112, an amorphous silicon b-layer 112a, and an amorphous silicon p-layer 113 are layered in that order on the transparent conductive film 110 as a power generation region. The amorphous silicon b-layer 112a is a composition change layer made of a-SiC, and the compound composition continuously changes from the amorphous silicon i-layer 112 to the amorphous silicon p-layer 113.

A comb-shaped surface metal collector 115 is formed on the amorphous silicon p-layer 113 via a surface transparent conductive film 114.

Hereinafter, a method for producing a thin film solar cell will be described.

First, a band-shaped flexible stainless steel plate is treated by the substrate treatment apparatus 100 of Example 4 using a roll-to-roll mechanism to form the band-shaped stainless steel substrate 108 with unevenness.

Thereafter, the metal reflecting electrode 109 is formed to a thickness of around 300 to 500 nm on the stainless steel substrate 108 by a sputtering apparatus using a roll-to-roll mechanism. The unevenness of the surface of the stainless steel substrate 108 is reflected on the surface of the metal reflecting electrode 109, and consequently, unevenness having a difference in height between convex portions and concave portions of around 0.1 to 0.5 μm is formed on the metal reflecting electrode 109. As a material for the metal reflecting electrode 109, generally, Ag, Al, and the like with high reflectivity may be used.

Then, the transparent conductive film 110 is formed to a thickness of around 50 nm on the metal reflecting electrode 109 by a sputtering apparatus using a roll-to-roll mechanism. The thickness of the transparent conductive film 110 is preferably in the range of about 50 to 500 nm. The unevenness of the surface of the metal reflecting electrode 109 is reflected on the surface of the transparent conductive film 110, and consequently, unevenness having a difference in height between convex portions and concave portions of around 0.1 to 0.5 μm is formed on the transparent conductive film 110.

The reason for providing the transparent conductive film 110 is to improve the reflectivity on the reverse surface of a solar cell. The transparent conductive film 110 may be formed by a CVD method or a vapor deposition method. Furthermore, ITO, SnO$_2$, ZnO, and the like can be used as a material for the transparent conductive film 110. However, in the case where materials other than ZnO are used, it is desirable that the surface of the transparent conductive film 110 is coated with ZnO to a thickness of hundreds of angstroms.

After the transparent conductive film 110 is formed, the amorphous silicon n-layer 111, the amorphous silicon i-layer 112, the amorphous silicon b-layer 112a (i.e., the composition change layer of a-SiC), and the amorphous silicon p-layer 113 are successively formed by a plasma CVD apparatus using a roll-to-roll mechanism. The plasma CVD apparatus has chambers for forming each layer, arranged along a transportation path of the flexible substrate, whereby these layers are continuously formed.

Herein, the growth conditions are set in such a manner that the amorphous silicon n-layer has a thickness of 70 nm, the amorphous silicon i-layer has a thickness of 500 nm, the amorphous silicon b-layer has a thickness of 10 nm, and the amorphous silicon p-layer has a thickness of 15 nm. The conditions of forming each layer are the same as shown in Table 1, except that the flow rate of CH$_4$ gas in the condition of forming the amorphous silicon b-layer is fixed to 32 sccm.

On the surface of each semiconductor layer, the unevenness of the surface of the respective underlying layer is reflected, and unevenness having a difference between convex portions and concave portions of around 0.1 to 0.5 μm is formed on each surface, respectively. More specifically, unevenness having a difference in height between convex portions and concave portions of around 0.1 to 0.5 μm is formed on the surface of the outermost surface of the layered structure for photoelectric transfer, i.e., the amorphous silicon p-layer 113.

Next, ITO or ZnO is deposited on the amorphous silicon p-layer 113 forming a power generation region having a thickness of 140 nm by a sputtering apparatus using a roll-to-roll mechanism, whereby the surface transparent electrode 114 is formed.

Finally, Ag is formed as a surface metal collector to a thickness of 500 nm on the surface transparent electrode 114 so as to have a comb-shape. In this case, the surface metal collector is also formed continuously above the band-shaped flexible substrate, using a roll-to-roll mechanism.

The output characteristics of the solar cell thus produced are as follows: a short-circuit current $I_{SC}$ of 19.1 mA/cm$^2$, a release voltage $V_{OC}$ of 0.87 volts, a curve factor FF of a curve Y of 0.72, and a conversion efficiency η of 12.0% are obtained. Compared with solar cell characteristics obtained by a conventional method for forming unevenness on a reverse reflecting metal, the short-circuit current improves by about 5% with high efficiency.

Conventionally, when a metal reflecting electrode is formed on a substrate of the thin film solar cell, minute unevenness is formed by setting the conditions of forming the metal reflecting electrode or conducting a heat treatment after the formation of the electrode, whereas, according to Example 5, minute unevenness can be directly formed on the surface of a substrate at low temperature and high speed.

More specifically, in a conventional thin film solar cell using a metal substrate, a metal reflecting electrode is formed so as to have unevenness for the purpose of scattering incident light. However, the temperature at which the metal reflecting electrode is formed is high, so that production yield is low.

In contrast, Example 5 uses a substrate which is directly provided with unevenness by sandblasting. Therefore, the unevenness can be formed on the surface of the substrate at room temperature. Furthermore, since sandblasting is continuously conducted by a treatment apparatus using a roll-to-roll mechanism, the unevenness can be efficiently formed on the surface of the substrate so as to be optimum for a thin film solar cell. This results in the production of thin film solar cells with good production yield.

As described above, according to the present invention, unevenness is directly formed on the surface of a substrate made of glass or the like by sandblasting, whereby the cost of a module can be reduced.

Furthermore, the Haze factor can be increased while the degree of unevenness on the surface of the substrate is prevented from becoming large. Therefore, a short-circuit current of a thin film solar cell can be improved by the increase in the Haze factor.

Furthermore, in the case where a metal substrate is used for the solar cell, the surface thereof can be provided with unevenness at room temperature. Therefore, there are no problems associated with taking a long time to increase and decrease the temperature of the substrate, thereby eliminating warping of the substrate. In addition, unevenness can be formed on the surface of a metal substrate, and at the same time, scratches over the entire surface of the substrate can be smoothed by sandblasting, even though the substrate is not subjected to a grinding treatment.

According to the present invention, while a flexible substrate is supplied to a treatment region by a roll-to-roll mechanism, the surface of the substrate is continuously subjected to sandblasting in the treatment region. Therefore, unevenness can be continuously formed on the substrate for a solar cell at a lower temperature and a higher speed compared with the conventional example. Moreover, the unevenness is formed by sandblasting, so that it can be made optimum for a solar cell.

Furthermore, solar cells with a higher short-circuit current and better characteristics can be produced with good production yield by forming thin film solar cells using the substrate treatment apparatus.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A substrate for a solar cell comprising:
   a first surface on which a layered structure for photoelectric transfer is to be formed, the first surface having a minute unevenness, the unevenness being formed by spraying the first surface of the substrate with abrasive grains; and
   a transparent conductive film formed above the first surface of the substrate, the transparent conductive film having a minute unevenness attributable to the unevenness of the first surface of the substrate,
   wherein the unevenness on the first surface of the substrate has a difference in height between convex portions and concave portions of around 0.1 to 0.5 $\mu$m, and wherein a height of the unevenness of the transparent conductive film is in approximately a same range as the unevenness of the first surface of the substrate.

2. The substrate for a solar cell according to claim 1, wherein the transparent conductive film is formed directly on the first surface of the substrate.

3. The substrate for a solar cell according to claim 1, wherein at least one other layer is interposed between the transparent conductive film and the first surface of the substrate.

4. A method for producing a solar cell, comprising the steps of:
   spraying abrasive grains onto a first surface of a substrate, the substrate having the first surface and a second surface, where the second surface of the substrate is substantially parallel to the first surface, thereby forming a minute unevenness on the first surface; and
   forming a transparent conductive film above the first surface of the substrate, the transparent conductive film having a minute unevenness attributable to the unevenness of the first surface,
   wherein an injection pressure for spraying the abrasive grains is around 2 to 10 kg/cm$^2$ and an injection distance is around 40 to 300 mm, wherein the unevenness on the first surface of the substrate has a difference in height between convex portions and concave portions of around 0.1 to 0.5 $\mu$m and the height of the unevenness of the transparent conductive film is in approximately the same range as the unevenness of the first surface of the substrate.

5. The method for producing a solar cell according to claim 4, further comprising the step of:
   forming a layered structure for photoelectric transfer on the first surface of the substrate, the layered structure having a third surface opposing the first surface, wherein the third surface has a minute unevenness whose difference in height between convex portions and concave portions is around 0.1 to 0.5 $\mu$m.

6. The method for producing a solar cell according to claim 5, wherein the transparent conductive film is formed on the first surface of the substrate between the first surface of the substrate and the layered structure for photoelectric transfer,
   wherein the substrate is made of glass or a transparent polymer, light is incident upon the second surface of the substrate, and a top surface of the transparent conductive film is in contact with the third surface of the layered structure for photoelectric transfer.

7. The method for producing a solar cell according to claim 4, wherein the transparent conductive film is formed directly on the first surface of the substrate.

8. The method for producing a solar cell according to claim 7, wherein the transparent conductive film is formed by sputtering.

9. The method for producing a solar cell according to claim 7, wherein ZnO or ITO is used for a material of the transparent conductive film.

10. The method for producing a solar cell according to claim 2, wherein the substrate is made of stainless steel or a polymer, and light is reflected from the first surface of the substrate.

11. The method for producing a solar cell according to claim 10, further comprising the step of:
    forming a metal reflecting electrode on the first surface of the substrate so as to be positioned between the first surface of the substrate and the layered structure for photoelectric transfer,
    wherein the surface of the metal reflecting electrode has a minute unevenness which is attributable to the unevenness of the first surface of the substrate, and whose difference in height between convex portions and concave portions is around 0.1 to 0.5 μm.

12. The method for producing a solar cell according to claim 10, further comprising the steps of:
   forming a metal reflecting electrode on the first surface of the substrate; and
   forming a transparent conductive film on the metal reflecting electrode.

13. A method for producing a solar cell, comprising the steps of:
   placing a band-shaped flexible substrate in such a manner that the flexible substrate is delivered from a first end, passes through a substrate treatment region, and reaches a second end; and
   continuously forming a minute unevenness on a surface of the flexible substrate by sandblasting in the substrate treatment region while the flexible substrate passes through the substrate treatment region.

14. A thin film solar cell, comprising:
   a substrate having a first surface;
   a transparent conductive film having a second surface, formed on the first surface of the substrate; and
   a semiconductor photoelectric structure for conducting photoelectric transfer, provided on the transparent conductive film so as to be in contact with the second surface of the transparent conductive film,
   wherein the first surface and the second surface each have a minute unevenness whose difference in height between convex portions and concave portions is around 0.1 to 0.5 μm, and wherein the unevenness in the second surface is attributable to the unevenness in the first surface and the height of the unevenness of the transparent conductive film is in approximately the same range as the unevenness of the first surface of the substrate.

15. A thin film solar cell, comprising:
   a substrate having a first surface;
   a reflecting electrode formed on the first surface of the substrate;
   a semiconductor photoelectric structure for conducting photoelectric transfer, provided on the reflecting electrode; and
   a transparent electrode formed on the semiconductor photoelectric structure,
   wherein the first surface of the substrate and the surfaces of the reflecting electrode and the semiconductor photoelectric structure each have a minute unevenness whose difference in height between convex portions and concave portions is around 0.1 to 0.5 μm, and wherein the unevenness in both the reflecting electrode and the semiconductor photoelectric structure are attributable to the unevenness in the first surface of the substrate and the height of the unevenness of the transparent conductive film is in approximately the same range as the unevenness of the first surface of the substrate.

16. The thin film solar cell according to claim 15, further comprising a transparent conductive film formed above the first surface of the substrate, the transparent conductive film having a minute unevenness attributable to the unevenness of the first surface of the substrate,
   wherein a surface of the transparent conductive film has an unevenness whose difference in height between convex portions and concave portions is around 0.1 to 0.5 μm.

17. The thin film solar cell according to claim 16, wherein the transparent conductive film is formed directly on the first surface of the substrate.

18. The thin film solar cell according to claim 16, wherein at least one other layer is interposed between the transparent conductive film and the first surface of the substrate.

19. A method for producing a thin film solar cell, comprising the steps of:
   continuously treating a flexible substrate by sandblasting to form a minute unevenness on a surface of the flexible substrate, thereby forming a substrate provided with a first surface having unevenness whose difference in height between convex portions and concave portions is around 0.1 to 0.5 μm;
   forming a metal layer on the first surface of the substrate in such a manner that the unevenness of the first surface of the substrate is reflected on a surface of the metal layer, thereby forming a reflecting electrode;
   forming a plurality of semiconductor layers on the reflecting electrode in such a manner that the unevenness of the surface of the reflecting electrode is reflected on surfaces of the semiconductor layers, thereby forming a semiconductor photoelectric structure for conducting photoelectric transfer; and
   forming a transparent conductive film on the semiconductor photoelectric structure in such a manner that the unevenness of the surfaces of semiconductor layers of the semiconductor photoelectric structure is reflected on a surface of the transparent conductive film, thereby forming a transparent electrode,
   wherein the surfaces of the metal layer, the plurality of the semiconductor layers and the transparent conductive film have a minute unevenness whose difference in height between convex portions and concave portions is around 0.1 to 0.5 μm and is attributable to the unevenness in the first surface of the first substrate.

* * * * *